United States Patent
Sudijono et al.

(10) Patent No.: US 6,787,452 B2
(45) Date of Patent: Sep. 7, 2004

(54) USE OF AMORPHOUS CARBON AS A REMOVABLE ARC MATERIAL FOR DUAL DAMASCENE FABRICATION

(75) Inventors: John Sudijono, Singapore (SG); Liang Choo Hsia, Singapore (SG); Liu Huang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/290,629

(22) Filed: Nov. 8, 2002

(65) Prior Publication Data

US 2004/0092098 A1 May 13, 2004

(51) Int. Cl.⁷ ......................................... H01L 21/4763
(52) U.S. Cl. ..................... 438/637; 438/702; 438/952
(58) Field of Search ................... 438/636, 637, 438/669, 702, 761, 763, 952

(56) References Cited

U.S. PATENT DOCUMENTS

| | | | |
|---|---|---|---|
| 6,214,637 B1 | 4/2001 | Kim et al. | 438/72 |
| 6,287,990 B1 | 9/2001 | Cheung et al. | 438/780 |
| 6,323,121 B1 | 11/2001 | Liu et al. | 438/633 |
| 6,350,390 B1 | 2/2002 | Liu et al. | 216/59 |
| 6,479,401 B1 * | 11/2002 | Linliu et al. | 438/763 |
| 6,635,583 B2 * | 10/2003 | Bencher et al. | 438/761 |

\* cited by examiner

*Primary Examiner*—Phuc T. Dang
(74) *Attorney, Agent, or Firm*—George O. Saile; Rosemary L. S. Pike

(57) ABSTRACT

An improved method of controlling a critical dimension during a photoresist patterning process is provided which can be applied to forming vias and trenches in a dual damascene structure. An amorphous carbon ARC is deposited on a substrate by a PECVD method. Preferred conditions are a RF power from 50 to 500 Watts, a bias of 500 to 2000 Watts, a chamber and substrate temperature of 300° C. to 400° C. with a trimethylsilane flow rate of 50 to 200 sccm, a helium flow rate of 100 to 1000 sccm, and an argon flow rate of 50 to 200 sccm. Argon plasma imparts an amorphous character to the film. The refractive index (n and k) can be tuned for a variety of photoresist applications including 193 nm, 248 nm, and 365 nm exposures. The α-carbon layer provides a high etch selectivity relative to oxide and can be easily removed with a plasma etch.

31 Claims, 3 Drawing Sheets

USE OF AMORPHOUS CARBON AS A REMOVABLE ARC MATERIAL FOR DUAL DAMASCENE FABRICATION

FIELD OF THE INVENTION

The invention relates to the field of fabricating integrated circuits and other electronic devices and in particular to an improved method of photoresist patterning that involves a removable anti-reflective coating during the formation of dual damascene structures.

BACKGROUND OF THE INVENTION

Photoresist processing is a key element that must be controlled in order to achieve a low cost, high throughput manufacturing method for the production of integrated circuits in semiconductor devices. Integrated circuits are typically formed by the sequential deposition of layers on a substrate. Each layer is usually patterned by first exposing a photoresist film on a substrate through a mask that contains a device pattern defined by opaque regions consisting of chrome and transparent regions such as quartz. Then the developed pattern in the photoresist film is transferred through an underlying substrate layer by means of a plasma etch process. Alternately, the photoresist pattern can serve as a mask for an ion implant step into an underlying layer. In back end of line (BEOL) processing, patterns consisting of trenches and via holes are filled with a conductive material to form interconnects comprised of horizontal connections or trenches within a layer and vertical connections or via holes between two layers. Conductive materials used in the interconnects are separated by insulating or dielectric materials to prevent crosstalk between the metal wiring. A popular method of manufacturing metal interconnects is a dual damascene structure in which vias and trenches are filled simultaneously with metal in an efficient, high yield process.

A low k dielectric material such as the example described in U.S. Pat. No. 6,287,990 is preferred as an insulation layer. Carbon is incorporated into a silicon dioxide layer to lower the k value. $SiO_2$ with a dielectric constant (k) of 4 has been widely used in the industry but new technology generations require a low k of about 2.5 or less. The layer in this prior art is deposited by a plasma enhanced chemical vapor deposition (PECVD) technique involving a silane having a Si—C—H moiety and an oxidizing gas such as oxygen or $N_2O$.

There is a constant focus on reducing the size of metal interconnects so that devices with higher performance can be provided to satisfy demand. The lithography method used to define patterns is constantly being optimized to enable the printing of features such as lines/spaces, trenches, or contact holes with smaller critical dimensions (CD). A CD is usually a small space width or line width that controls the ultimate performance of the device. For example, finer gate widths allow a faster transistor speed while denser line/space arrays result in more memory storage per unit area. A smaller critical dimension (CD) in a feature such as a trench is more easily printed when the process is optimized to decrease the K constant or when $\lambda$ is reduced according to the equation, $R=K\lambda/NA$. R is the minimum CD that can be resolved while K is a process constant, $\lambda$ is the exposure wavelength, and NA is the numerical aperture of the exposure tool. In recent years, technology nodes have progressively moved from 250 nm through 180 nm and 130 nm and are now in the 100 nm regime for CD sizes. As a result, the preferred $\lambda$ which has been 248 nm for CD sizes from about 250 nm through 130 nm is now shifting to 193 nm for features smaller than 130 nm.

The process constant K can be lowered in a variety of ways such as phase shifted masks, improved illumination methods, and optimized photoresist imaging techniques. No matter which wavelength of radiation is used to expose the photoresist, reflectivity control of radiation off the underlying layer is always a concern. Typically, a CD specification includes the requirement that the feature must be maintained within ±10% of a targeted dimension. This includes mask error factors, photoresist line width variations, and an etch transfer component. Therefore, the photoresist contribution to the ±10% allowed variation must be considerably less than 10% in order not to consume the entire budget. One method that has been successfully implemented in many cases is an anti-reflective coating or ARC which is coated prior to the photoresist and greatly minimizes the reflected light from the substrate during the exposure process. The ARC thickness is typically around 1000 Angstroms or less while some photoresist layers have a thickness as thin as 2000 Angstroms. The photoresist pattern must be transferred through the ARC and into an underlying substrate. A thin ARC is preferred since the ARC/photoresist etch rate ratio is close to 1:1 and enough photoresist must remain after the ARC open etch to serve as an etch mask for transferring the pattern into the substrate.

CD variations in the photoresist pattern may result from topography in which the substrate is not level. This leads to thickness variations in the photoresist coating that can be larger than 100 Angstroms. Small changes in photoresist thickness on the order of 100 Angstroms or less are known to result in significant CD variations. Even if the substrate is level, differing compositions within the substrate may cause a CD variation in the photoresist pattern. For example, the photoresist pattern may cross over metal lines contained within the substrate. The metal lines are likely to have a higher reflectivity than the surrounding substrate and thereby cause a higher amount of reflected light which re-exposes the photoresist from below. If the photoresist feature is a line/space array crossing above a metal line, the resulting photoresist line will be smaller in width where it passes over metal than where it crosses over a less reflective part of the substrate. This is true for a positive tone composition in which regions of exposed photoresist are washed away in an aqueous base developer and unexposed areas remain on the substrate. For negative tone photoresists, exposed regions remain on the substrate and unexposed areas are washed away in developer. With a negative tone composition, a photoresist line would become larger with an increased dose from reflected light. In either case, reflectivity control provided by an ARC is crucial for maintaining a line width or CD within a ±10% specification and for achieving a manufacturable process when a highly reflective substrate is involved.

A photoresist process is further characterized by its process latitude which is the range of exposure dose and focus settings that can be applied while still maintaining the CD within a ±10% variation. By controlling reflectivity, an ARC enables a larger process latitude than is realized in the absence of an ARC. Thus, an ARC can prevent a considerable amount of expensive rework caused by a CD being out of specification. Reworking a substrate consists of stripping the patterned film, recoating and re-exposing a new photoresist layer. Rework slows throughput by tying up process and measurement tools for unscheduled period of time.

An important property of an ARC is that its refractive index which is comprised of a real component (n) and an imaginary component (k) can be tuned in many cases by adjusting the composition of the material to minimize reflectivity at the photoresist/ARC interface which improves line width control in the photoresist layer. Another valuable property of an ARC is a high optical absorbance so that light which enters the ARC layer does not reflect off the underlying substrate and re-expose the photoresist layer from below. ARCs are commercially available as organic spin-on coatings that are baked at curing temperatures of about 175° C. to 225° C. to render them immiscible with liquid photoresist solutions that are subsequently spin coated on the ARC. Inorganic ARCs such as $SiO_xN_y$ can be deposited with a PECVD technique at temperatures up to 400° C. Examples of both types are provided in U.S. Pat. No. 6,323,121 in which a silicon oxynitride is formed as an etch stop material and a spin-on organic ARC is used to protect the bottom of a via during a trench etch. Organic ARCs are generally removed with a plasma ashing method.

An ARC described in U.S. Pat. No. 6,350,390 is applied for the purposed of improving CD control during photoresist patterning while fabricating a gate electrode. The ARC is either an organic polymer coating or a dielectric material containing silicon. A method of removing the ARC is not discussed. The main point is to further control the gate size by adjusting the trim etch to compensate for line width variations in the photoresist masking layer.

In U.S. Pat. No. 6,214,637 an amorphous carbon ARC is formed by a PECVD method at a preferred temperature of around 200° C. involving a hydrocarbon gas such as methane but no carrier gas is included. The initial refractive index of n=1 is increased to a 1.2 to 2.5 range by annealing the layer and optionally with additives such as oxygen, silicon, and fluorine. The extinction coefficient (k component) is maintained within a range of 0.2 to 0.8. Oxygen and argon plasma are later used to remove this ARC which has a thickness between 150 and 10000 Angstroms. An important property is that the refractive index remains constant at all thickness above 150 Angstroms.

Photoresist patterning in a dual damascene structure has unique challenges, especially when forming a trench in a via first process. For example, the photoresist process must contend with considerable topography since an opening on a level surface is produced at the same time as removing exposed photoresist inside a hole below the trench level. Although silicon nitride and silicon oxynitride are commonly employed as an etch stop layer at the top of a damascene stack and have been used as ARCs, these materials are known to interact with photoresists, especially those that operate by a chemical amplification mechanism in which one photon from the exposing radiation can generate a strong acid that causes many chemical events in the photoresist film. Trace amounts of nitrogen containing compounds such as ammonia in the inorganic ARCs can neutralize the acid within the photoresist layer and thereby interfere with the imaging process. One frequent result is a foot at the bottom of the photoresist profile where exposed photoresist which should have been removed by developer remains on the substrate. This undesirable feature can influence a subsequent etch transfer step by projecting a wider CD than intended in the design. A vertical sidewall on the photoresist profile is preferred for etch transfer.

Organic ARCs can also interact with an overlying photoresist during the patterning process. These ARCs often contain thermal acid generators that are used to cure the anti-reflective coating. If the thermal curing is incomplete, trace amounts of acid may be released into the overlying photoresist and thereby induce a chemical reaction. In a positive tone photoresist, an undercut at the base of the sidewall may result. If the line width is small as in a gate feature, the line may topple over and an expensive rework process is necessary to correct the problem.

Therefore, it is desirable to employ an ARC that does not contain traces of acid or base which can interfere with a photoresist patterning process. The ARC must also be immiscible with photoresist layers that are coated on it. Another valuable property is to have a refractive index (n and k values) that is tunable in order to be compatible with a number of different photoresists that may be required for various layers in the fabrication process. An ARC should also be easily removed such that no residues remain on the substrate and it must be readily implemented in manufacturing to enable a low cost, high throughput fabrication scheme. During dual damascene processing, the ideal ARC can be applied as an etch stop at the top of the stack and also assist in CD control of a photoresist patterning step. In this case, the ARC should provide a high etch selectivity relative to the underlying dielectric layer during pattern transfer of a via opening in the photoresist through the dielectric layer.

SUMMARY OF THE INVENTION

An objective of the present invention is to provide a removable ARC that does not contain traces of acid or base that can interfere with an overlying photoresist during a patterning process.

A further objective of the present invention is to provide a removable ARC that has a tunable refractive index to minimize reflectivity and improve CD control for a number of different photoresists.

A still further objective of the present invention is to provide an ARC that can be easily removed without leaving residues and which can be readily incorporated into a manufacturing scheme.

A still further objective of the present invention is to provide an ARC than can be incorporated into a dual damascene scheme as an etch stop layer that enables a high etch selectivity with respect to pattern transfer through an underlying dielectric layer.

To achieve these objectives an ARC comprising an amorphous carbon layer is incorporated into a fabrication method for making integrated circuits in semiconductor devices. In one embodiment, the ARC is formed by a PECVD method on a substrate. A methyl silane, preferably trimethylsilane, is employed as the carbon source and is transported into the deposition chamber by a carrier gas such as helium. Argon plasma is used as the amorphising agent which is defined as the means of imparting amorphous character into the carbon film. Typical plasma conditions are a RF power of 50 to 500 Watts, a bias of 500 to 2000 Watts, and a temperature of 300° C. to 400° C. Argon flow is between 50 and 200 standard cubic centimeters per minute (sccm) while helium flow is 100 to 1000 sccm and trimethylsilane flow is 50 to 200 sccm. In this manner, an amorphous carbon ARC with n=1.3–1.6 @ 193 nm and k=0.25 to 0.68 @ 193 nm is produced. The oxide/α-carbon etch ratio is 18:1 when n=1.43 and k=0.4 and the etch rate ratio is 50:1 when n=1.55 and k=0.67. The gas mixture can be adjusted to tune the n and k values and the etch ratio relative to oxide.

Once the ARC is formed on a substrate, a photoresist is spin coated on the ARC and patterned. The resulting feature in the photoresist layer is transferred through the ARC with a plasma etch such as one generated from oxygen and $CF_4$ gas. When the opening is formed in the ARC, the etch is changed to a plasma that selectively removes the underlying substrate while the ARC serves as an etch mask. After the etch transfer is complete, the remaining photoresist is removed with a stripper and the ARC is removed with a plasma etch such as $CF_4$ and oxygen or both layers can be removed with a plasma etch. The amorphous carbon layer does not contain an acid or base and does not intermix with the photoresist layer. Furthermore, it can be tuned so that the refractive index provides a minimum amount of reflected light to re-expose the photoresist from below. Since trimethylsilane is readily available, it can be easily attached to a PECVD chamber in a manufacturing scheme.

In a second embodiment, the ARC described in the first embodiment is deposited as the top layer in a dual damascene stack wherein it is formed over a dielectric layer. A photoresist is then coated on the ARC, baked, exposed, and developed to form a via opening. The via opening is transferred through the ARC and then through the dielectric layer by employing the ARC as an etch mask with a high etch selectivity relative to the dielectric material. The original photoresist is stripped and replaced with a second photoresist that is patterned to form a trench opening which is transferred through the ARC and into the dielectric layer. In both patterning steps, the ARC helps to control the CD within a tight specification and does not interact with the photoresist to produce a foot or undercut profile. The second photoresist and ARC are then removed by an ashing method. A liner is deposited in the trench and via hole followed by deposition of a metal. The final step in forming the dual damascene structure is to planarize the metal by a process such as chemical mechanical polish (CMP) so that it is coplanar with the top of the dielectric layer.

DETAILED DESCRIPTION OF THE INVENTION

The present invention is particularly useful for photoresist patterning to form a via hole and a trench in a via first dual damascene process and etch transferring the pattern into an underlying dielectric layer. However, the method is not limited to dual damascene fabrication and may be applied in any situation where an ARC is necessary to control reflectivity Therefore, the scope of the invention is not limited to the drawings which are intended to illustrate the preferred embodiments.

Figure 1A:
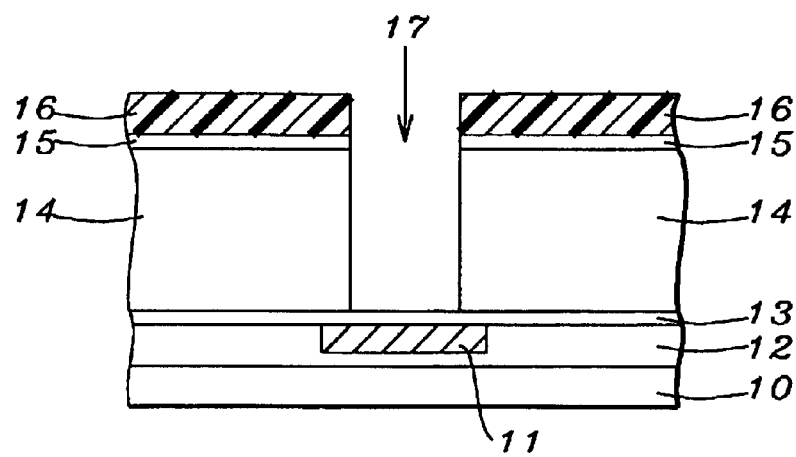
FIGS. 1a–1e are cross sectional views depicting one embodiment of the present invention.

The first embodiment is illustrated in FIGS. 1a–1e. Referring to FIG. 1a, a substrate 10 is provided upon which a conductive layer his formed within a dielectric layer 12. Substrate 10 typically has a substructure of active and passive devices that are not shown in order not to obscure the key features of the present invention. Substrate 10 can be based on silicon, silicon/germanium, gallium/arsenide or silicon on insulator (SOI) technology. Dielectric layer 12 is preferably formed of a low k dielectric material in order to provide good insulating properties and is normally deposited by a PECVD technique although an optional deposition method can be used to form dielectric layer 12. Some commonly used low k materials are fluorosilicate glass (FSG), carbon doped silicon dioxides, polyimides, polyarylethers, polysilsesquioxanes and borophosphosilicate glass. A photoresist layer (not shown) is coated on dielectric layer 12 and patterned to form an opening which is etch transferred into the dielectric layer 12. After the photoresist is removed, the opening is filled with a conductive layer 11 comprised of copper or a copper alloy, aluminum or an aluminum alloy, tungsten or a tungsten alloy or a metal silicide. The conductive layer 11 is planarized with a CMP step so that it is coplanar with the top of dielectric layer 12.

A barrier liner of silicon carbide 13 is deposited by a PECVD technique on dielectric layer 12 and has a thickness of between about 200 and 1000 Angstroms. One PECVD process for depositing SiC includes a gas combination of trimethylsilane, tetramethyl silane, and $CO_2$. Silicon carbide 13 functions as an etch stop during a subsequent trench etch and also protects conductive layer 11 from chemicals such as the aqueous base developer used to remove photoresist in a later trench patterning step. Silicon nitride and silicon oxynitride can also be employed as an etch stop layer (barrier liner).

Next a low k dielectric layer 14 is deposited on silicon carbide layer 13 and has a thickness of between 2000 and 15000 Angstroms. Dielectric layer 14 is preferably comprised of FSG or a carbon doped oxide but may also be selected from the group of materials that are candidates for dielectric layer 12.

At this point an amorphous carbon layer 15 is deposited on dielectric layer 14 by a PECVD method. The source of carbon is a methyl silane compound such as methyl-silane, dimethylsilane, or preferably trimethylsilane which is transported into the CVD chamber by a helium carrier gas. A key feature of the invention is that argon is employed as an amorphising agent to create an amorphous character in the carbon layer. Typical plasma conditions are a RF power of from 50 to 500 Watts, a bias of from 500 to 2000 Watts, chamber and substrate temperature of 300° C. to 400° C. with a trimethylsilane flow rate of between 50 and 200 sccm, a helium flow rate of between 100 and 1000 sccm, and an argon flow rate of from 50 to 200 sccm. The refractive index values (n and k) can be tuned by adjusting the gas mixture to provide a range of n values from 1.3 to about 1.6 at 193 nm and a range of k values from 0.25 to about 0.68 at 193 nm. The etch ratio of the underlying oxide layer to the α-carbon layer also varies with n and k and changes from 18:1 when n=1.43 and k=0.4 to 50:1 when n=1.55 and k=0.67. The amount of amorphous character can be adjusted by the argon flow rate. In general, the refractive index n decreases as amorphous content increases.

It should be noted that the a-carbon layer 15 just described is tuned for a 193 nm photoresist but optical measurements could be taken at 248 nm in order to optimize n and k for a Deep UV (248 nm) photoresist or at 365 nm to tune n and k for an i-line photoresist process. Deep UV resists are generally preferred for forming feature sizes between about 130 nm and 300 nm while 193 nm resists are the leading candidates for printing feature sizes from about 130 nm to 100 nm or below. I-line photoresists are widely utilized for feature sizes above 300 nm because of a lower cost process but they do not have resolution capability below about 300 nm. Therefore, the α-carbon layer 15 can be tuned to control reflectivity for any photoresist patterning step including 193 nm, 248 nm, and 365 nm sensitive compositions and is applicable to either positive tone or negative tone photoresist layers. The preferred thickness range for α-carbon layer 15 is from about 100 to about 1500 Angstroms. The preferred n and k values for the α-carbon layer 15 are determined by the square root of the refractive index (n) for the photoresist. The n and k values for the α-carbon layer can be lowered by increasing the RF power and can be increased with a larger Ar/trimethylsilane gas ratio.

A photoresist is then spin coated on α-carbon layer 15 and is baked to remove organic solvent to form a photoresist layer 16 having a thickness from about 2000 to about 8000 Angstroms. There is no intermixing of α-carbon layer 15 and photoresist layer 16 that can have a detrimental effect on the properties of said layers. Photoresist layer 16 is pattern-wise exposed using a mask that is positioned in the exposure tool and is aligned with substrate 10 which is held by a chuck on a stage in the exposure tool. Most advanced photoresists are based on a chemical amplification mechanism and require a post exposure bake to drive the chemical reaction in exposed regions to a completion within a predetermined time that is normally one to two minutes. Then the substrate is developed in an aqueous base solution to form a via 17 in photoresist layer 16. Vertical sidewalls with no foot or undercut are formed in the via 17 because there is no acid or base in α-carbon layer 15 that can interact with photoresist layer 16.

Via 17 is etch transferred through the exposed α-carbon ARC 15 by a plasma etch method that usually includes oxygen and a fluorocarbon such as $CF_4$. Some or all of the photoresist layer 16 is removed during this etch. Finally, the via 17 is transferred through the dielectric layer 14 with an anisotropic etch which is performed with a fluorocarbon gas like $CHF_3$ or $C_4F_8$. As mentioned previously, the α-carbon layer 15 provides a high etch selectivity for this step on the order of between 18:1 and 50:1 which means the dielectric layer 14 is removed at a rate up to 50 times faster than the α-carbon layer 15. All of the photoresist layer 16 is normally removed by the second etch step but a conventional wet stripping process may be applied to remove any photoresist residue.

Figure 1B:
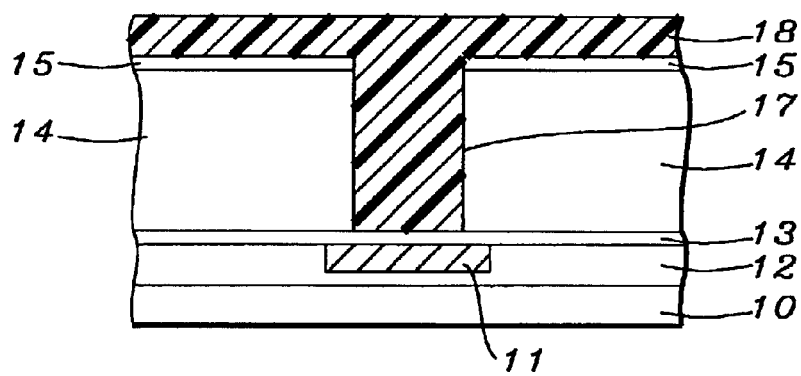

Next a second photoresist is spin coated on the α-carbon layer 15 and baked to form a photoresist layer 18 as shown in FIG. 1b. Photoresist layer 18 also fills the via 17 and has a thickness of from about 2000 to 8000 Angstroms above the α-carbon layer 15. Preferably, the photoresist layer 18 is the same as photoresist layer 16 or is sensitive to the same wavelength range as photoresist layer 16 so that the α-carbon layer 15 is equally effective in controlling CD for both the via and trench patterning steps.

Figure 1C:
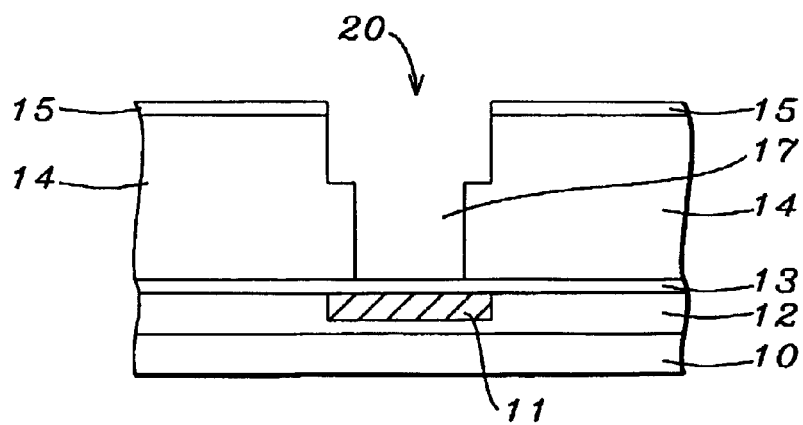

Referring to FIG. 1c, the photoresist layer 18 is exposed, post-expose baked and developed to produce a trench 20 in photoresist layer 18. Vertical sidewalls with no foot or undercut are formed in the trench 20 because there is no acid or base in α-carbon layer 15 that can interact with photoresist layer 18. Since reflectivity is controlled, the CD variation of the trench 20 can be maintained within a ±10% specification over a wide range of exposure dose and focus settings. An anisotropic plasma etch method is then used to transfer the trench 20 through α-carbon layer 15 with an appropriate gas as cited previously for etching the via 17. The trench 20 is also transferred into dielectric layer 14 with a gas chemistry mentioned earlier and is timed to stop at a point wherein the bottom of the trench 20 is from about 1000 to about 6000 Angstroms above the barrier liner 12.

Figure 1D:
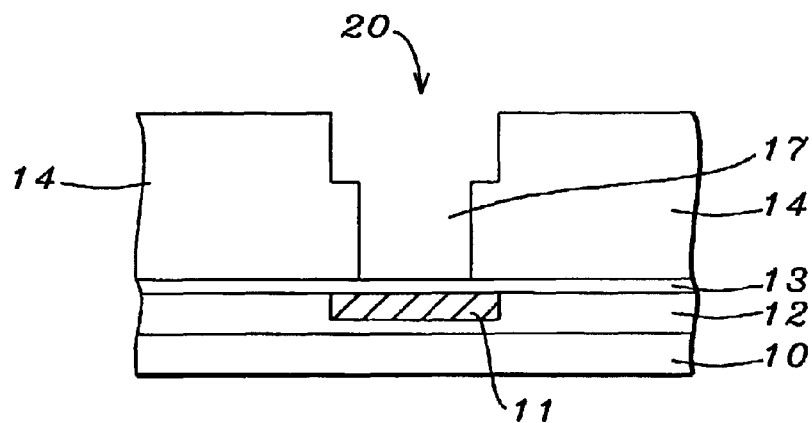

Referring to FIG. 1d, any remaining photoresist layer 18 and α-carbon layer 15 are then removed by a plasma ashing step with the following conditions: an oxygen flow rate of from 100 to 500 sccm; a RF power of about 100 to 600 Watts; and a chamber pressure of about 20 to 200 mTorr. The α-carbon layer 15 is readily removed and leaves no residues. Silicon carbide layer 13 is next removed at the bottom of the via 17 by a plasma etch known to those skilled in the art.

Figure 1E:
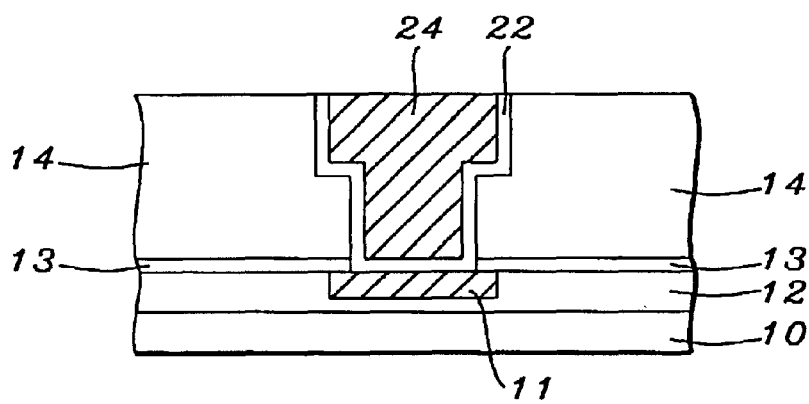

As shown in FIG. 1e, a liner 22 such as TiN, TaN, or WN is then deposited on the sidewalls and bottom of the via 17 and trench 20 to protect the metal which is used to fill the dual damascene openings. The liner 22 is typically from about 50 to 400 Angstroms thick. The dual damascene structure is completed by depositing a metal layer 24 comprised of copper, aluminum or an Al/Cu alloy to a level above the trench 20 and then lowering the surface with a planarizing method. For example, a CMP step may be employed to make the metal layer 24 coplanar with the top of dielectric layer 14.

Figure 2A:
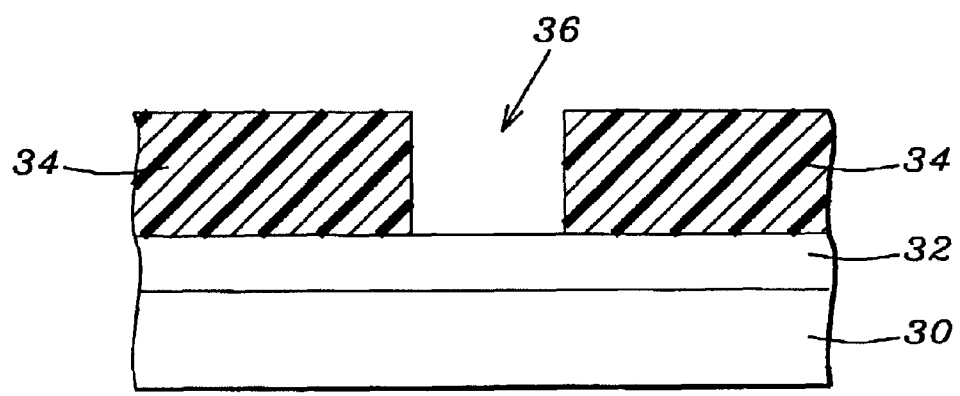
FIGS. 2a–2d are cross sectional views illustrating another embodiment of the present invention.

A second embodiment is depicted in FIGS. 2a–2d. Referring to FIG. 2a, a substrate 30 is provided which may have a substructure containing active and passive devices that are not shown in order to simplify the drawing and direct attention to the key aspects of the present invention. An amorphous carbon layer 32 is then deposited on substrate 30 by a PECVD method in which a methylsilane such as methylsilane, dimethylsilane, or preferably trimethylsilane is transported into a CVD chamber with helium gas. A key feature of the invention is that argon is employed as an amorphising agent to create an amorphous character in the carbon layer. Typical plasma conditions are a RF power of from 50 to 500 Watts, a bias of from 500 to 2000 Watts, chamber and substrate temperature of 300° C. to 400° C. with a trimethylsilane flow rate of between 50 and 200 sccm, a helium flow rate of between 100 and 1000 sccm, and an argon flow rate of from 50 to 200 sccm. The preferred thickness range for α-carbon layer 32 is from about 200 to about 1000 Angstroms. The refractive index values (n and k) can be tuned by adjusting the gas mixture to provide a range of n values from 1.3 to about 1.6 at 193 nm and a range of k values from 0.25 to about 0.68 at 193 nm.

While α-carbon layer 32 just described is tuned for a 193 nm photoresist, optical measurements could be taken at 248 nm in order to optimize n and k for a Deep UV (248 nm) photoresist or at 365 nm to tune n and k for an i-line photoresist process. Deep UV resists are generally preferred for forming feature sizes between about 130 nm and 300 nm while 193 nm resists are the leading candidates for printing feature sizes from about 130 nm to 100 nm or below. I-line photoresists are widely utilized for feature sizes above 300 nm because of a lower cost process. Therefore, the α-carbon layer 32 can be tuned to control reflectivity for any photoresist patterning step including 193 nm, 248 nm, and 365 nm sensitive compositions and is applicable to either positive tone or negative tone photoresist layers. One CVD chamber can be dedicated to coating several ARCs by dialing in the necessary gas flow rates to form an α-carbon layer 32 with n and k values tuned to a particular photoresist application. This is an advantage over spin-on organic ARCs in which a different composition is required for each exposure wavelength. As a result, different slots in spin coating tools must be assigned to each ARC composition and more chemicals in the manufacturing line drives a higher cost for quality control. Spin-oh ARCs must be carefully monitored so that particles which tend to accumulate in the ARC solution while in storage do not form to the extent that they cause defects in the coated film.

A photoresist is then spin coated on the α-carbon layer 32 and is baked to remove organic solvent to form a photoresist layer 34 having a thickness from about 2000 to about 8000 Angstroms. There is no intermixing of α-carbon layer 32 and photoresist layer 34 that can have a detrimental effect on the properties of said layers. Photoresist layer 34 is pattern-wise exposed using a mask that is positioned in the exposure tool and is aligned with substrate 30 which is held by a chuck on a stage in the exposure tool. Most advanced photoresists are based on a chemical amplification mechanism and require a post exposure bake to drive the chemical reaction in exposed regions to a completion within a predetermined time that is normally one to two minutes. Then the substrate is developed in an aqueous base solution to form a feature such as opening 36 in photoresist layer 34. A large process latitude is realized in which a wide range of exposure dose and focus settings can be applied while still maintaining CD control. Optionally, a mask may be inserted that generates a photoresist line such as a gate or the mask may contain a contact hole design. Vertical sidewalls with no foot or undercut are formed in opening 36 as shown in FIG. 2a because there is no acid or base in the α-carbon layer 32 that can interact with photoresist layer 34. Therefore, α-carbon layer 32 has an advantage over inorganic ARCs that contain nitrogen such as $Si_3N_4$ and $SiO_XN_Y$. Furthermore, the amorphous content of the α-carbon ARC 32 can be more reliably controlled with argon plasma compared to prior art α-carbon examples that do not contain argon in the deposition process.

The α-carbon layer 32 is especially effective in controlling CD when patterning the photoresist layer 34 over a highly reflective substrate 30 or when the surface of substrate 30 is comprised of two or more materials, one of which is more reflective than the other.

Figure 2B:
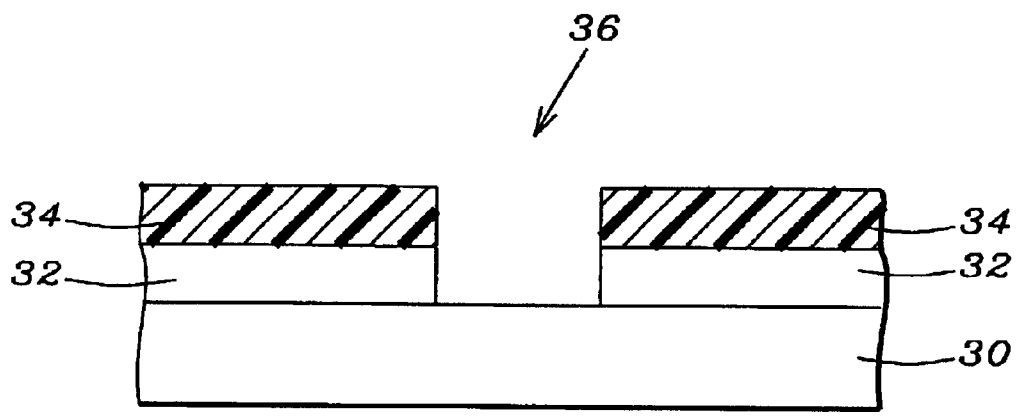
Figure 2C:
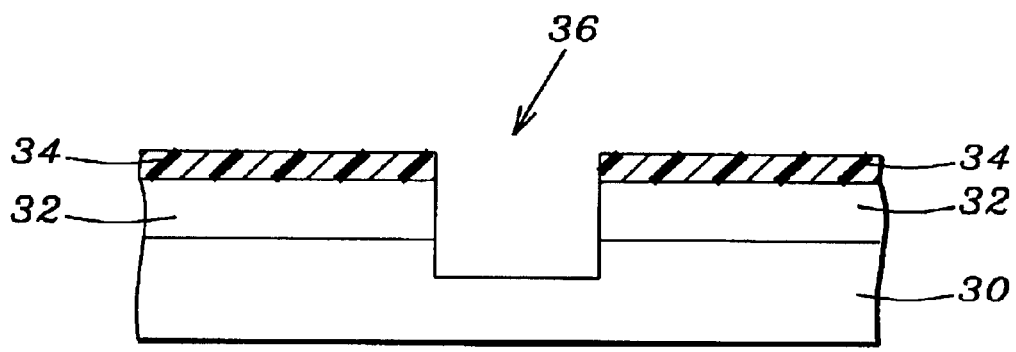
Figure 2D:
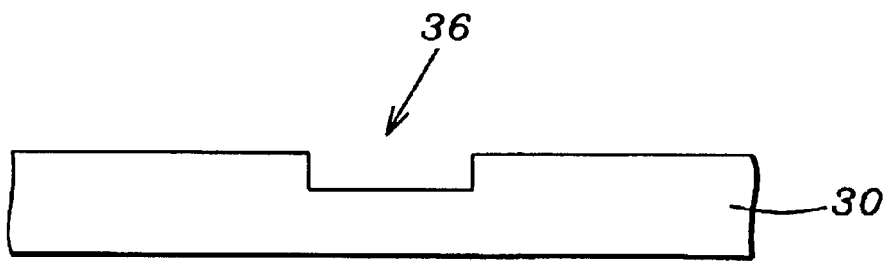

Opening 36 is etch transferred through the exposed α-carbon ARC 32 as shown in FIG. 2b by a plasma etch method that usually includes oxygen and a fluorocarbon such as $CF_4$. Some or all of the photoresist layer 34 is removed during this etch depending upon the thickness of the α-carbon layer 32 and photoresist layer 34 and the etch conditions. The opening 36 is then transferred into substrate 30 with a plasma composition that provides a high etch selectivity of the α-carbon layer 32 relative to substrate 30. Those skilled in the art will recognize the appropriate gas composition that will afford a selective etch into substrate 30 as depicted in FIG. 2c.

Once the etch transfer to a desired depth into substrate 30 is complete, any remaining photoresist layer 34 and α-carbon layer 32 are removed by a plasma ashing method involving an oxygen flow rate of from 100 to 500 sccm, a RF power of about 100 to 600 Watts, and a chamber pressure of between about 20 and 200 mTorr. No residues are formed during removal of α-carbon layer 32. Substrate 30 now has an opening 36 as shown in FIG. 1d wherein the CD has been maintained to within a ±10% specification.

A removable ARC has been demonstrated that satisfies all of the important requirements for a layer used to control CD in a photoresist patterning process. The α-carbon layer described herein is inert towards the overlying photoresist layer to enable vertical sidewalls in the resulting pattern that translates into a reliable etch transfer. Meanwhile, a large process window is achieved by minimizing reflectivity and this reduces rework and lowers cost for the fabrication method. The method can be readily implemented in a manufacturing scheme since introducing the gas mixture into existing CVD chambers is straightforward and removing the material from the substrate is easily accomplished. The method is flexible in that the refractive index of the material can be tuned to be compatible with any photoresist simply by adjusting the process conditions within the same CVD chamber.

While this invention has been particularly shown and described with reference to, the preferred embodiments thereof, it will be understood by those skilled in the art that various changes in form and details may be made without departing from the spirit and scope of this invention.

We claim:

1. A dual damascene method comprising:
   (a) providing a substrate with a stack of layers formed thereon, said stack comprising a barrier liner and a dielectric layer over said barrier liner;
   (b) forming an amorphous carbon anti-reflective coating (ARC) over said dielectric layer with a PECVD method that includes a methyl silane source gas;
   (c) forming a via in said amorphous carbon ARC and in said stack by coating and patterning a first photoresist layer on said amorphous carbon ARC and transferring said pattern through said amorphous carbon ARC and through said dielectric layer with an etch;
   (d) removing said first photoresist layer and with coating a second photoresist layer on said amorphous carbon ARC that fills said via;
   (e) forming a trench in said second photoresist layer that is aligned above said via and transferring said trench through the amorphous carbon ARC and into said dielectric layer;
   (f) removing said second photoresist layer and said amorphous carbon ARC and removing said barrier liner at the bottom of said via; and
   (g) depositing a liner on the sidewalls and bottom of said via and said trench, depositing a metal layer to a level above said trench, and plananzing the metal layer to be coplanar with the top of said dielectric layer.

2. The method of claim 1 wherein said barrier liner is a silicon carbide layer having a thickness from about 200 to about 1000 Angstroms.

3. The method of claim 1 wherein said dielectric layer is selected from a group of materials including fluorosilicate glass, carbon doped silicon dioxide, polyarylethers, polyimides, borophosphosilicate glass, and polysilsesquioxanes.

4. The method of claim 1 wherein said dielectric layer has a thickness between about 2000 and 15000 Angstroms.

5. The method of claim 1 wherein said amorphous carbon ARC is deposited by a PECVD method to a thickness between about 100 and 1500 Angstroms.

6. The method of claim 1 wherein said PECVD method comprises a RF power of from 50 to 500 Watts, a bias of from 500 to 2000 Watts, a chamber temperature of from 300° C. to 400° C., a trimethylsilane flow rate of about 50 to 200 sccm, a He flow rate from about 100 to 1000 sccm, and an argon flow rate from about 50 to 200 sccm.

7. The method of claim 6 wherein said amorphous carbon ARC has a refractive index, n, between about 1.3 and 1.6 at 193 nm and a k value between about 0.25 and 0.68 at 193 nm.

8. The method of claim 6 wherein the RF power is increased to decrease the refractive index (n).

9. The method of claim 6 wherein the argon/trimethylsilane flow rate ratio is increased to increase the refractive index (n).

10. The method of claim 6 wherein increasing the argon flow rate increases the amorphous content of said amorphous carbon ARC.

11. The method of claim 1 wherein said amorphous carbon ARC is compatible with either a positive tone or negative tone photoresist.

12. The method of claim 1 wherein the etch rate of said dielectric layer relative to said amorphous carbon ARC is from about 18:1 to 50:1.

13. The method of claim 1 wherein the bottom of said trench is at a distance between about 1000 and 6000 Angstroms above the bottom of said via.

14. The method of claim 1 wherein said second photoresist layer and said amorphous carbon ARC are removed with a plasma etch comprised of an RF power from about 100 to 600 Watts, an oxygen flow from about 100 to 500 sccm, and a chamber pressure between about 20 and 200 mTorr.

15. The method of claim 1 wherein said liner is comprised of TiN, TaN, WN, Ti or Ta and has a thickness between about 50 and 400 Angstroms.

16. The method of claim 1 wherein said metal layer is comprised of copper, aluminum, or a copper/aluminum alloy.

17. The method of claim 1 wherein the second photoresist layer is sensitive to the same wavelength as used to pattern the first photoresist layer, thereby enabling said amorphous carbon ARC to be effective in controlling reflectivity for both photoresist patterning steps.

18. The method of claim 6 wherein methylsilane or dimethylsilane are used to replace trimethylsilane as the source of carbon.

19. A method of using an anti-reflective coating (ARC) during a photoresist patterning process and subsequent etch transfer comprising:

(a) providing a substrate;

(b) depositing an amorphous carbon ARC on said substrate;

(c) coating and patterning a photoresist layer on said amorphous carbon ARC;

(d) transferring said pattern through the amorphous carbon ARC and into said substrate with one or more etch steps; and (e) removing said photoresist layer and said amorphous carbon ARC with a plasma etch step.

20. The method of claim 19 wherein the substrate is comprised of silicon, doped polysilicon, silicon/germanium, gallium/arsenide, a metal, an oxide, nitride, carbide, oxynitride or a combination of more than one of the aforesaid materials.

21. The method of claim 19 wherein said amorphous carbon ARC is deposited by a PECVD method to a thickness between about 100 and 1500 Angstroms.

22. The method of claim 21 wherein said PECVD method comprises a RF power of from 50 to 500 Watts, a bias from about 500 to 2000 Watts, a chamber temperature of 300° C. to 400° C., a trimethylsilane flow rate from about 50 to 200 sccm, a He flow rate from about 100 to 1000 sccm, and an argon flow rate from about 50 to 200 sccm.

23. The method of claim 22 wherein said amorphous carbon ARC has a refractive index, n, between about 1.3 and 1.6 at 193 nm, and a k value between about 0.25 and 0.68 as measured at 193 nm.

24. The method of claim 22 wherein the RF power is increased to decrease the refractive index (n).

25. The method of claim 22 wherein the argon/trimethylsilane flow rate ratio is increased to increase the refractive index (n).

26. The method of claim 22 wherein increasing the argon flow rate increases the amorphous content of said amorphous carbon ARC.

27. The method of claim 19 wherein said amorphous carbon ARC is compatible with either a positive tone or negative tone photoresist layer.

28. The method of claim 19 wherein said photoresist layer and said amorphous carbon ARC are removed with a plasma etch comprised of an RF power from about 100 to 600 Watts, an oxygen flow rate from about 100 to 500 sccm, and a chamber pressure from about 20 to 200 mTorr.

29. The method of claim 19 wherein the pattern is comprised of an opening such as a via or trench, a line/space array, or a semi-isolated or isolated line such as in a gate feature or a combination of one or more of the aforesaid features.

30. The method of claim 19 wherein said substrate is highly reflective or is comprised of two or more materials that have a differing reflectivity of the light used to expose said photoresist layer.

31. The method of claim 22 wherein methylsilane or dimethylsilane is used in place of trimethylsilane as the carbon source.

* * * * *